United States Patent [19]
Erb et al.

[11] Patent Number: 5,440,275
[45] Date of Patent: Aug. 8, 1995

[54] MARKER SWEEP LINEARIZATION SYSTEM AND METHOD

[75] Inventors: Tom Erb; Thomas Springer, both of Austin, Tex.

[73] Assignee: T.N. Technologies Inc., Round Rock, Tex.

[21] Appl. No.: 282,957

[22] Filed: Jul. 29, 1994

[51] Int. Cl.$^6$ .......................... H03L 7/00; H03L 7/12; H03L 7/16; H03L 7/20
[52] U.S. Cl. ....................................... 331/4; 331/1 A; 331/19
[58] Field of Search ....................... 331/1 A, 4, 19, 37, 331/38, 39, 40, 41, 44, 175, 178

[56] References Cited

U.S. PATENT DOCUMENTS

| | | | |
|---|---|---|---|
| 3,619,802 | 11/1971 | Lohrmann | 331/4 |
| 4,129,832 | 12/1978 | Neal et al. | 331/44 |
| 4,499,435 | 2/1985 | Thomson et al. | 331/44 |
| 4,728,906 | 3/1988 | Turl et al. | 331/4 |
| 4,904,956 | 2/1990 | Dennis et al. | 331/4 |
| 4,904,964 | 2/1990 | Peng et al. | 331/123 |
| 4,998,217 | 3/1991 | Holcomb et al. | 364/573 |
| 5,015,971 | 5/1991 | Taylor et al. | 331/16 |

OTHER PUBLICATIONS

John L. Daniewicz, "Using Radarr Level Measurement for Increased Environmental Protection and Plant Safety," 1991, pp. 1201–1212 *ISA*, 1991 paper #91-0470.

*Primary Examiner*—David Mis
*Attorney, Agent, or Firm*—Fishman, Dionne & Canto

[57] ABSTRACT

A multi-marker microwave sweep linearization system comprising a voltage controlled microwave oscillator utilizing an adaptive sweep control circuit is presented. The oscillator control voltage is to be adjusted as necessary to maintain a constant spacing between markers. To produce the markers, the output of the oscillator is mixed with the output at a comb generator having harmonics. The lower side bands generated as the oscillator sweeps past the comb frequencies generates a series of 'chirps', centered about each of the comb harmonics. It will be noted, that the frequency of the chirp passes through zero when the oscillator frequency is exactly equal to one of the comb harmonics. The marker is to be associated with a higher frequency in the chirp envelope to avoid phase uncertainties. This can be accomplished with a frequency-detector circuit which may comprise a retriggerable monostable multi-vibrator having a time constant equal to the period of the frequency to be detected. The multi-vibrator is preceded by a high speed comparator which squares up the chirp signal. At the onset of the chirp, the signal amplitude is too low to be detected by the comparer. The comparer threshold is set with hysteresis to allow triggering when the chirp frequency is higher than the desired marker detection frequency. Further, by averaging several sweeps it is possible to get very precise marker position measurements. Any long term change in the oscillator frequency versus voltage characteristics which degrades sweep linearity will be manifested as a shift in the position of one of the markers, and the sweep voltage can be readily adjusted to compensate for it.

11 Claims, 4 Drawing Sheets

MARKER SWEEP LINEARIZATION SYSTEM AND METHOD

BACKGROUND OF THE INVENTION

The present invention relates to linearization of frequency sweep systems. More specifically, the present invention relates to a marker sweep linearization system for linearizing the sweep of a voltage controlled oscillator over a selected frequency range.

In present signal generation and processing systems, it is often necessary to produce a signal whose frequency can be varied or swept over a prescribed range. Typically, this requires accurate tracking of signal frequency to a selected sweep control input. In many signalling applications, such as radar, spectrum analyzers, etc. the requisite sweep must be linear with time, i.e., a linear frequency ramp, to cover the frequency range of interest. Generally, a voltage controlled oscillator is used to produce a signal whose frequency can be varied or swept over a prescribed range, since it produces an output frequency that is directly related to an input control voltage. Unfortunately, voltage controlled oscillators are inherently nonlinear (i.e., oscillator frequency is not a linear function of sweep voltage). Further, voltage controlled oscillators tend to drift unpredictably with time and temperature.

Prior art linearization circuits are described in U.S. Pat. Nos. 4,129,832; 4,499,435: 4,904,964; and 4,998,217 which are discussed more fully below. The above list is only exemplary and is not intended to be a complete list of the prior art.

U.S. Pat. No. 4,129,832 to Neal et al discloses a linearization system for voltage controlled oscillator sweep generators wherein a ramp signal is preprogrammed to control the input voltage of the oscillator. A difference frequency is compared to a reference frequency to determine a required adjustment to the ramp signal.

U.S. Pat. No. 4,499,435 to Thomson et al discloses a system for linearizing sweep of a voltage control oscillator employing both a calibration mode and a measurement mode. In the calibration mode a sweep rate of the voltage control oscillator is slowed down (as it is known that voltage control oscillators have greater linearity at lower frequencies) and the signals processed to define an intended ramp which is linear with time.

U.S. Pat. No. 4,904,964 to Peng et al discloses a voltage control oscillator circuit utilizing modulation compensation to yield a constant modulated level over a frequency band. The capacitance for coupling the modulating signal to a compensated input of the voltage control oscillator is varied to compensate the input of the voltage control oscillator.

U.S. Pat. No. 4,998,217 to Holcomb et al discloses a sweep generator linearization system. The system has two modes of operation, a calibration mode and a measurement mode. In the calibration mode the voltage controlled oscillator is locked at low, center and high frequencies and the corresponding voltages are measured. This information is utilized by a microprocessor to linearize the sweep. During the measuring mode two sweeps are made at different rates to assure that the center frequency occurs at the midpoint of the sweep cycle. When the microprocessor determines that the shift in the center frequency in time from the midpoint of the sweep cycle is not acceptable the system can be switched back to the calibration mode, as described above.

SUMMARY OF THE INVENTION

In accordance with the present invention, a multi-marker microwave sweep linearization system comprising a voltage controlled microwave oscillator (e.g., the oscillator is swept from 9.5 GHz to 10.5 GHz) utilizing an adaptive sweep control circuit is presented. The oscillator control voltage is to be adjusted as necessary to maintain a constant spacing between markers, defined below. To produce the markers, the output of the oscillator is mixed with the output at a comb generator having harmonics at multiples of 100 MHz. The lower side bands generated as the oscillator sweeps past the comb frequencies generates a series of 'chirps', centered about each of the comb harmonics. It will be noted, that the frequency of the chirp passes through zero when the oscillator frequency is exactly equal to one of the comb harmonics. The marker is to be associated with a higher frequency in the chirp envelope to avoid phase uncertainties. This can be accomplished with a frequency-detector circuit which may comprise a retriggerable monostable multi-vibrator having a time constant equal to the period of the frequency to be detected. The multi-vibrator is preceded by a high speed comparator which squares up the chirp signal. At the onset of the chirp, the signal amplitude is too low to be detected by the comparer. The comparer threshold is set with hysteresis to allow triggering when the chirp frequency is higher than the desired marker detection frequency. Further, by averaging several sweeps it is possible to get very precise marker position measurements. Any long term change in the oscillator frequency versus voltage characteristics which degrades sweep linearity will be manifested as a shift in the position of one of the markers, and the sweep voltage can be readily adjusted to compensate for it.

None of the aforementioned patents disclose a frequency marker system wherein the oscillator control voltage is adjusted to maintain constant spacing between the markers as a means for linearizing. An important feature of the present invention is that linearization and measurement (operation) are performed at simultaneously.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DESCRIPTION OF THE PREFERRED EMBODIMENT

Figure 1:
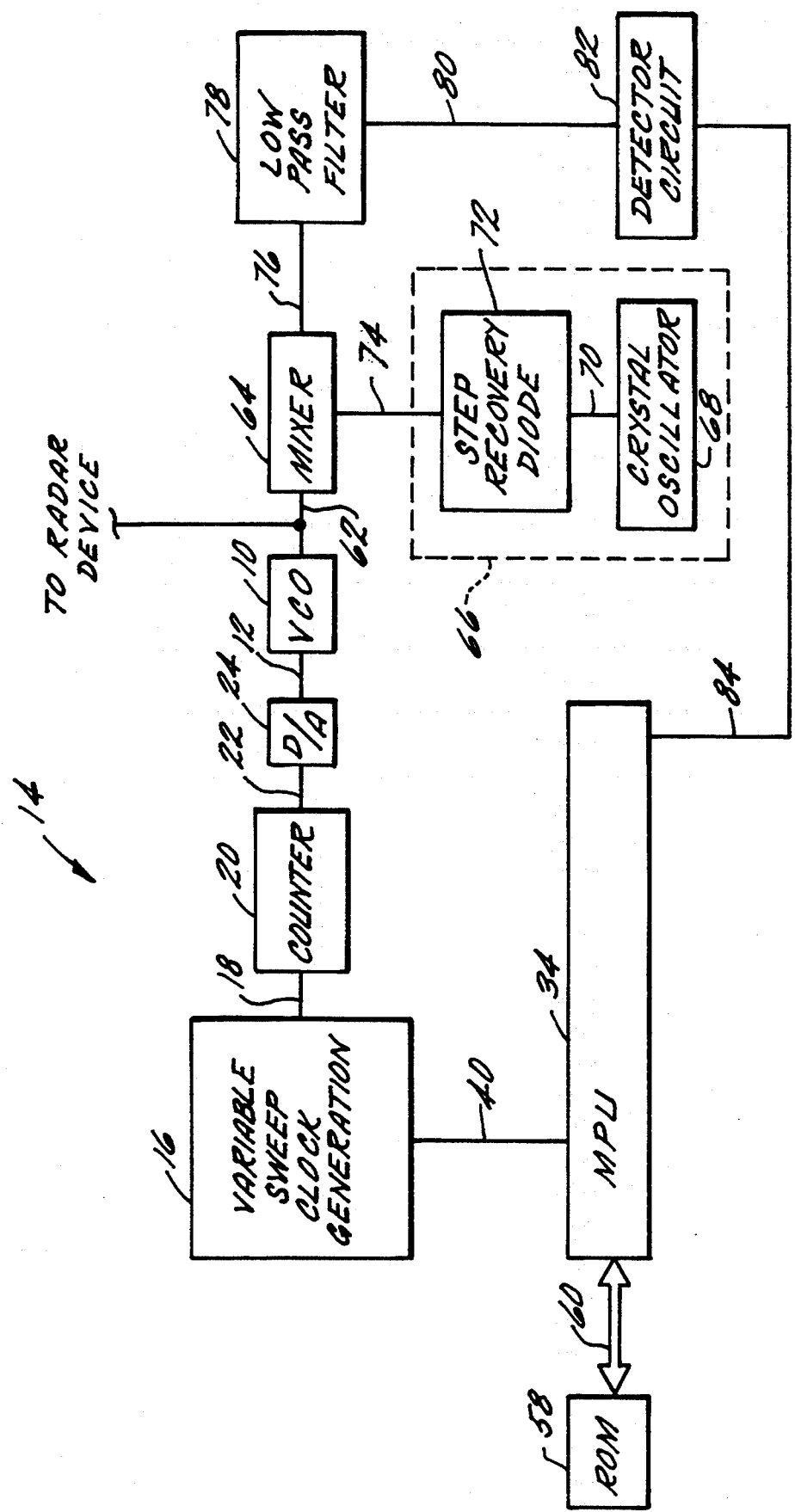
FIG. 1 is a schematic block diagram of a marker sweep linearization circuit// in accordance with the present invention.

Prior to describing, in detail, the particular improved sweep linearization system of the present invention, it will be appreciated that the present invention resides primarily in a novel structural combination of conventional electronic components and interface circuits, and not in the particular detailed configurations thereof. Accordingly, the structure, control, and arrangement of these conventional components and circuits have, for the most part, been illustrated in the drawings by readily understandable block representations and a schematic diagram, which show only those specific details that are pertinent to the present invention, in order not to obscure the disclosure with structural details which will be readily apparent to those skilled in the art having the benefit of the description herein. Thus, the block diagram illustration of FIG. 1 does not necessarily represent the mechanical structural arrangement of the exemplary system, but is primarily intended to illustrate the major structural components of the system in a convenient functional grouping, whereby the present invention can be more readily understood.

Referring now to FIG. 1, wherein a schematic block diagram of the present invention is shown, a voltage controlled oscillator (VCO), the output of which is to be controlled in accordance with a prescribed input controlled voltage which varies with time is shown generally at 10. The input of VCO 10 is connected by a line 12 to a sweep generator circuit 14. Sweep generator circuit 14 comprises a variable frequency sweep clock generator 16 having an output connected by a line 18 to the input of a counter 20. The output of counter 20 is connected by a line 22 to the input of a digital-to-analog (D-to-A) converter 24. The output of D-to-A converter 24 is connected by line 12 to the input of VCO 10. VCO 10 be may employed for supplying the frequency sweep signal for microwave radar level measurement device (i.e., radar tank gauges), as is known.

A microprocessor (MPU) 34, which can be of a known type, includes a plurality of inputs and outputs for respectively receiving and sending information and control signals relating to operation of the microwave radar level measurement device. MPU 34 is connected by a line 40 to variable sweep clock generator 16 to selectively vary the clock rate thereof (in this example, to generate a sweep between 9.5 GHz to 10.5 GHz at VCO 10). A read only memory (ROM) circuit 58 communicates with MPU 34 by way of a bi-directional bus 60.

Figure 2:
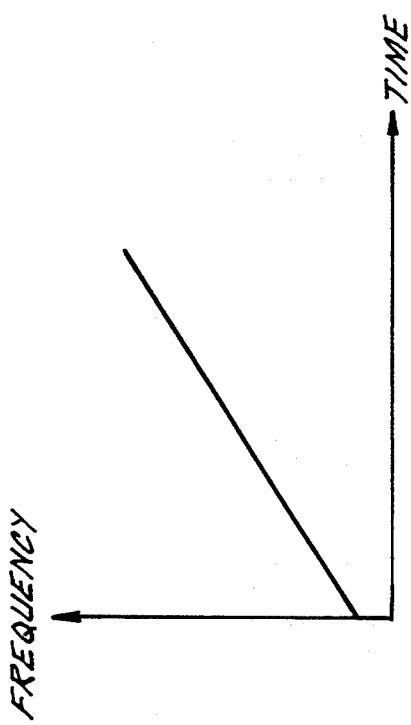
FIG. 2 is a plot of frequency verses time of an ideal sweep characteristic for the output of a VCO.
Figure 3:
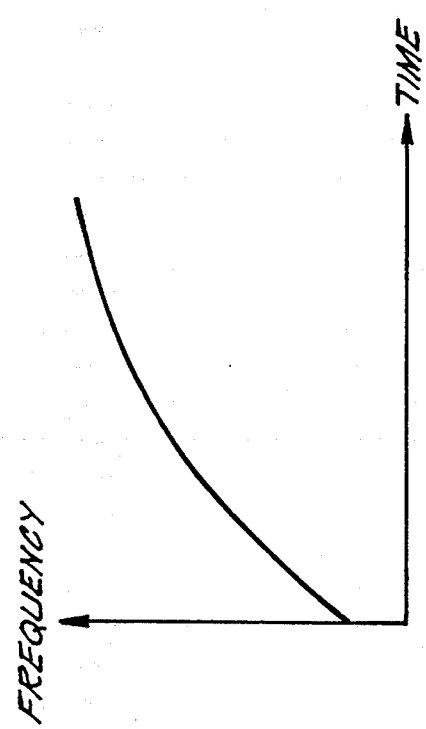
FIG. 3 is a plot of frequency verses time of a typical prior art sweep characteristic for the output of a VCO.

Ideally, the output of VCO 10 will have a linear saw tooth shape (i.e., for frequency as a function time), a portion of which is shown in FIG. 2. However, due to the inherent non-linear nature of VCO 10 the actual output of VCO 10 is generally non-linear, as shown in prior art FIG. 3. This non-linearity is highly undesirable in the field of radar measuring, as such non-linearity results in significant measurement errors.

Figure 4:
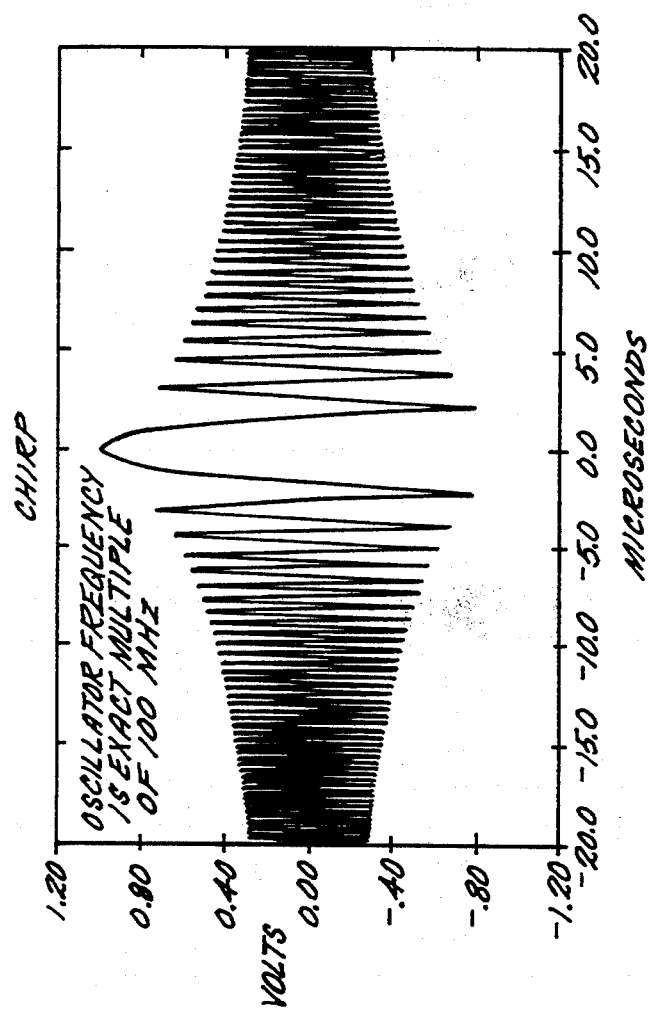
FIG. 4 is a plot of voltage verses time for chirp envelope in accordance with the present invention.

The output of VCO 10 on a line 62 is presented to the appropriate connection in the radar device in which it is being employed (typically to a mixer at the antenna) as well as to an input of a mixer 64. A comb generator 66 having harmonics at multiples of 100 MHz comprises a 100 MHz crystal oscillator 68 connected by a line 70 to a step recovery diode 72. The output of diode 72 is connected by a line 74 to mixer 64 where it mixed with the output of VCO 10 to produce a difference frequency signal. The lower side bands generated as the output signal of VCO 10 sweeps past the comb frequencies generates a series of 'chirps', centered about each of the comb harmonics. A resulting chirp envelope at a line 76 (the output of mixer 64, in other words a difference frequency signal resulting from the two signals input to mixer 64) is shown in FIG. 4. The amplitude variation of the chirp envelope results from attenuation of higher frequency components by parasitic capacitance. It will be noted, that the frequency of the chirp passes through zero when the oscillator frequency of VCO 10 is exactly equal to one of the comb harmonics. These harmonics are very stable, and therefore, the comb generator provides a reference against which linearity of the oscillator frequency sweep of VCO 10 can be compared.

While it would seem logical to use the zero-crossing at d.c. (see, FIG. 4) as a marker, this is not desirable. The phase angle of the chirp with respect to VCO 10 is a random function; near the center of the chirp the uncertainty in the position of the marker is several microseconds. However, the multi-marker system of the present invention only requires that the spacing between the markers be consistent, and by associating the marker with a higher frequency in the chirp envelope the uncertainty in phase is less significant (i.e., as a percent of the total sweep). Accordingly, the chirp envelope on line 76 is connected to the input of a low pass filter 78, where only the higher frequencies in the chirp envelope are passed through. This output of low pass filter 78 is presented on a line 80 to a detector circuit 82. Detector circuit 78 generates the markers which are presented to MPU 34 by a line 84, the spacing between the markers is monitored and the input to VCO 10 is adjusted to maintain constant spacing between the markers. When the spacing between the markers is maintained constant the output of VCO 10 is linear.

Figure 5:
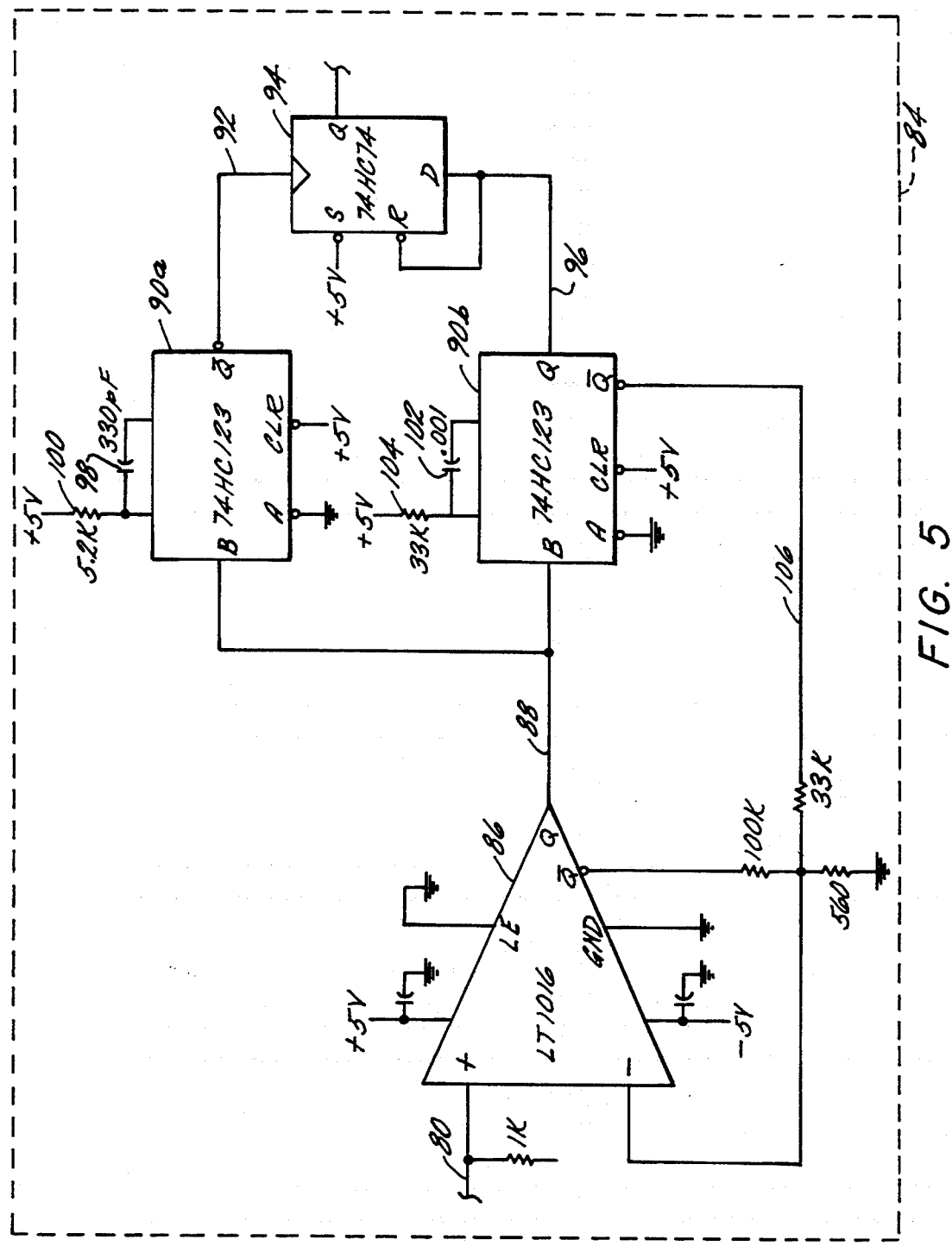
FIG. 5 is schematic diagram of the detector circuit in FIG. 1.

Referring to FIG. 5 a schematic diagram of detector circuit 78 is shown. Detector circuit 78 comprises a high speed comparator (e.g., LT1016) 86 which has the non-inverting input thereof connected to low pass filter 78 by line 80. The output of comparator 86 is connected by a line 88 to inputs of a dual retriggerable monostable multi-vibrator or one-shot (e.g., 74HC123) 90a and 90b. Comparator 86 squares up the chirp signal. One-shot 90a has its complement output connected to the clock pulse input of a RS flip-flop (e.g., 74HC74) 92 by a line 94. One-shot 90b has its output connected to the reset input of flip-flop 92 by a line 96. The set input of flip-flop 92 is at a logical high (i.e., it is tied to +5 vdc). A capacitor 98 and a resistor 100 determine the time out for the output pulse of one-shot 90a. A capacitor 102 and a resistor 104 determine the time out for the output pulse of one-shot 90b. The complement output of one-shot 90b is connected by a line 106 to the inverting input of comparator 86.

Before the occurrence of each chirp, one-shoots 90a and 90b are 'triggerable', and the output of flip-flop 94 is a logical low, since one-shoot 90b is forcing a reset. At the onset of the chirp, the signal amplitude is too low to be detected by comparator 86. The threshold of comparator 86 is set with hysteresis to allow triggering when the chirp frequency is higher than the desired marker detection frequency. Once the chirp level is high enough, comparator 86 is triggered, thereby firing one-shoots 90a and 90b. At this point the chirp frequency is still high and the wave form makes several zero-crossings, causing comparator 86 to switch from a logical high to a logical low. The time constants for both one-shoots 90a and 90b is sufficient for them to remain on (i.e., triggered) while comparator 86 switches to a logical low, until it switches back to a logical high again on the next positive crossing and retriggers one-shoots 90a and 90b. Again, the hysteresis around comparator 86 ensures that comparator 86 will be sensitive enough to detect each zero-crossing.

Figure 6:
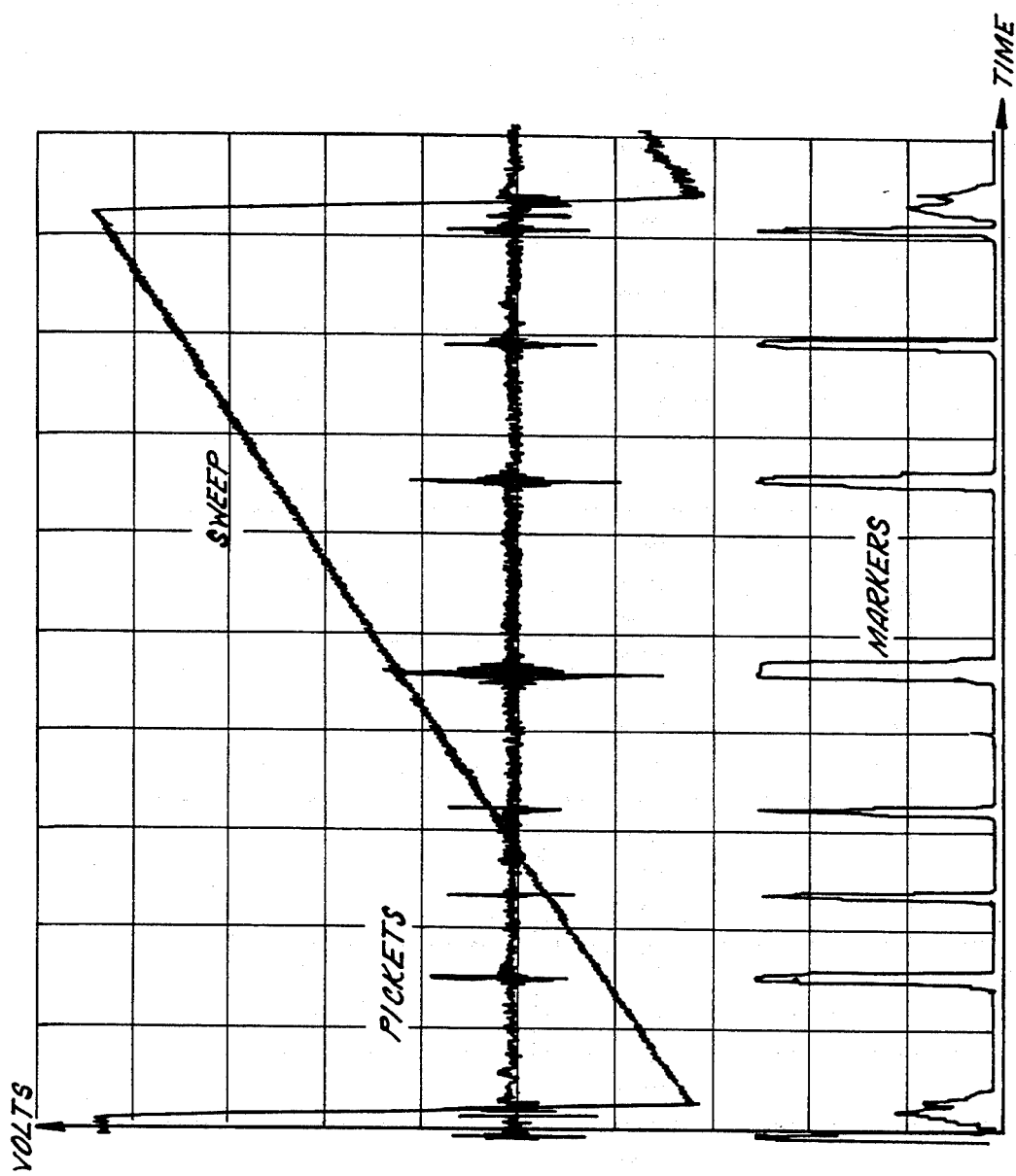
FIG. 6 is a plot of frequency verses time for the pickets, markers and sweep of the present invention.

Further along in the chirp envelope the time between zero-crossings is greater. Accordingly, as the chirp frequency decreases, the period of the difference frequency eventually becomes long enough for one-shoot 90a to time out. This results in flip-flop 94 being clocked, generating a logical low to a logical high transition at the output of flip-flop 94, in other words generating a marker, see FIG. 6. The markers are presented to MPU 34 by line 84 where they are used by a linearization algorithm, which is stored in ROM 58. MPU 34 controls variable sweep clock generator 16 in response to the linearization algorithm, whereby amplitude and rate of amplitude change is controlled. The time constant of one-shoot 90b is long enough so that it remains in a triggered state for the duration of the chirp, that is, until the amplitude of the signal finally decreases to the point where it fails to retrigger one-shoot 90b. Once one-shoot 90b times out, it applies hysteresis to comparator 86 to desensitize the comparator, rendering comparator 86 incapable of responding to the diminished signal and firing twice within a single chirp envelope. Flip-flop 94, in response to the timing out of one-shoot 90b, resets and its output goes to a logical low, whereby detector circuit 82 is ready to detect and generate the next marker.

Moreover, by selecting a relatively high detection frequency, the phase uncertainty is less significant, since it represents a smaller portion of the sweep interval. When several sweeps are averaged it is possible to get very precise marker position measurements. Any long term change in the oscillator frequency versus voltage characteristics which degrades sweep linearity will be manifested as a shift in the position of one of the markers, and the sweep voltage can be readily adjusted to compensate for it, as described below.

In accordance with the present invention, a multimarker microwave sweep linearization system comprising a voltage controlled microwave oscillator (e.g., the oscillator being swept from 9.5 GHz to 10.5 GHz) utilizing an adaptive sweep control circuit is presented. The oscillator control voltage is to be adjusted, by controlling the variable sweep clock generator as necessary, to maintain a constant spacing between markers.

While preferred embodiments have been shown and described, various modifications and substitutions may be made thereto without departing from the spirit and scope of the invention. Accordingly, it is to be understood that the present invention has been described by way of illustrations and not limitation.

We claim:

1. A circuit for linearizing the frequencies of an output signal of a voltage controlled oscillator with time, comprising:

adjustable sweep generator means for generating a control voltage signal, said control voltage signal having an amplitude which changes with respect to time, said control voltage signal being presented to an input of said voltage controlled oscillator;

comb generator means for generating a comb signal having a plurality of harmonic components;

signal mixing means for mixing said output signal of said voltage controlled oscillator with said comb signal to produce a chirp envelope centered about each of said harmonic components of said comb signal;

marker means for generating a marker signal having a plurality of markers, each of said markers being associated with a frequency in a corresponding said chirp envelope; and means for generating a sweep control signal, in response to said marker signal, which maintains relatively constant spacing between each of said markers, said adjustable sweep generator means being responsive to said sweep control signal to control said amplitude of said control voltage signal.

2. The circuit of claim 1 wherein said adjustable sweep generator means comprises:

variable sweep clock generator means responsive to said sweep control signal, said variable sweep clock generator means for generating a sweep clock signal comprising a plurality of pulses;

counter means receptive to said sweep clock signal for counting said pulses to provide a count signal; and digital to analog converter means for converting said count signal to said voltage control signal.

3. The circuit of claim 1 wherein said comb generator means comprises:

oscillator means for generating a frequency signal; and step recovery diode means receptive to said frequency signal for generating said comb signal.

4. The circuit of claim 1 wherein said marker means comprises:

comparator means having an input receptive to said chirp envelope and having an output, said comparator means for comparing a voltage of said chirp envelope to a threshold voltage and for generating a signal at said output of said comparator means when said voltage of said chirp envelope exceeds said threshold voltage;

first one-shoot means having an input connected to said output of said comparator means and having an output, said first one-shoot means for generating a pulse having a selected time out when said first one-shoot means is triggered by said signal at said output of said comparator means;

second one-shoot means having an input connected to said output of said comparator means and having an output, said second one-shoot means for generating a pulse having a selected time out when said second one-shoot means is triggered by said signal at said output of said comparator means; and flip-flop means having an input connected to said output of each of said first and second one-shoot means and having an output, said flip-flop means for generating said markers in response to said pulses from said first and second one-shoots.

5. A system for linearizing the frequencies of an output signal of a voltage controlled oscillator with time, comprising:

adjustable sweep generator means for generating a control voltage signal, said control voltage signal having an amplitude which changes with respect to time, said control voltage signal being presented to an input of said voltage controlled oscillator;

comb generator means for generating a comb signal having a plurality of harmonic components;

signal mixing means for mixing said output signal of said voltage controlled oscillator with said comb signal to produce a chirp envelope centered about each of said harmonic components of said comb signal;

marker means for generating a marker signal having a plurality of markers, each of said markers being associated with a frequency in a corresponding said chirp envelope; and processor means, responsive to said marker signal, and having memory means for storing signals including program signals defining an executable algorithm for defining a sweep control signal which maintains relatively constant spacing between each of said markers, said adjustable sweep generator means being responsive to said sweep control signal to control said amplitude of said control voltage signal.

6. The system of claim 5 wherein said adjustable sweep generator means comprises:

variable sweep clock generator means responsive to said sweep control signal, said variable sweep clock generator means for generating a sweep clock signal comprising a plurality of pulses;

counter means receptive to said sweep clock signal for counting said pulses to provide a count signal; and digital to analog converter means for converting said count signal to said voltage control signal.

7. The system of claim 5 wherein said comb generator means comprises:

oscillator means for generating a frequency signal; and step recovery diode means receptive to said frequency signal for generating said comb signal.

8. The system of claim 5 wherein said marker means comprises:

comparator means having an input receptive to said chirp envelope and having an output, said comparator means for comparing a voltage of said chirp envelope to a threshold voltage and for generating a signal at said output of said comparator means when said voltage of said chirp envelope exceeds said threshold voltage;

first one-shoot means having an input connected to said output of said comparator means and having an output, said first one-shoot means for generating a pulse having a selected time out when said first one-shoot means is triggered by said signal at said output of said comparator means;

second one-shoot means having an input connected to said output of said comparator means and having an output, said second one-shoot means for generating a pulse having a selected time out when said second one-shoot means is triggered by said signal at said output of said comparator means; and flip-flop means having an input connected to said output of each of said first and second one-shoot means and having an output, said flip-flop means for generating said markers in response to said pulses from said first and second one-shoots.

9. A method for linearizing the frequencies of an output signal of a voltage controlled oscillator with time, comprising the steps of:

generating a control voltage signal having an amplitude which changes with respect to time, said control voltage signal being presented to an input of said voltage controlled oscillator;

generating a comb signal having a plurality of harmonic components;

mixing said output signal of said voltage controlled oscillator with said comb signal to produce a chirp envelope centered about each of said harmonic components of said comb signal;

generating a marker signal having a plurality of markers, each of said markers being associated with a frequency in a corresponding said chirp envelope; and controlling said amplitude of said control voltage signal to maintain relatively constant spacing between each of said markers.

10. The method of claim 9 wherein said step of generating said control voltage signal comprises:

generating a sweep clock signal comprising a plurality of pulses;

counting said pulses to provide a count signal; and converting said count signal to said voltage control signal.

11. The method of claim 9 wherein said step of generating said marker signal comprises:

comparing a voltage of said chirp envelope to a threshold voltage;

generating a compared signal when said voltage of said chirp envelope exceeds said threshold voltage;

generating a first pulse having a selected time out in response to said compared signal;

generating a second pulse having a selected time out in response to said compared signal; and generating said markers in response to said first and second pulses.

* * * * *